(12) United States Patent
Grant et al.

(10) Patent No.: US 10,313,053 B2
(45) Date of Patent: Jun. 4, 2019

(54) ENHANCED AUTOMATIC IDENTIFICATION SYSTEM

(71) Applicant: Universtiy of South Australia, Adelaide, South Australia (AU)

(72) Inventors: Alexander James Grant, Adelaide (AU); Andre Pollok, Adelaide (AU); Gottfried Lechner, Adelaide (AU); David Victor Lawrie Haley, Adelaide (AU); Robert George McKilliam, Adelaide (AU); Ingmar Rudiger Land, Adelaide (AU); Marc Pierre Denis Lavenant, Adelaide (AU)

(73) Assignee: Myriota Pty Ltd, Adelaide (AU)

( * ) Notice: Subject to any disclaimer, the term of this patent is extended or adjusted under 35 U.S.C. 154(b) by 154 days.

(21) Appl. No.: 14/913,775

(22) PCT Filed: Aug. 22, 2014

(86) PCT No.: PCT/AU2014/000832
§ 371 (c)(1),
(2) Date: Feb. 23, 2016

(87) PCT Pub. No.: WO2015/024062
PCT Pub. Date: Feb. 26, 2015

(65) Prior Publication Data
US 2016/0277145 A1      Sep. 22, 2016

(30) Foreign Application Priority Data

Aug. 23, 2013   (AU) ................................ 2013903219

(51) Int. Cl.
*H04L 1/00*        (2006.01)
*H03M 13/29*       (2006.01)
(Continued)

(52) U.S. Cl.
CPC .......... *H04L 1/0041* (2013.01); *H03M 5/145* (2013.01); *H03M 13/2957* (2013.01);
(Continued)

(58) Field of Classification Search
CPC ....... H04L 1/0041; H04L 1/00; H04L 1/0045; H04L 1/0061; H04L 1/0071; H03M 5/145;
(Continued)

(56) References Cited

U.S. PATENT DOCUMENTS 5,644,601 A * 7/1997 Kawaguchi ......... H04L 25/4915
                                                341/58
6,004,028 A * 12/1999 Bottomley ............ H04L 1/004
                                                714/758

(Continued)

OTHER PUBLICATIONS

"Recommendation ITU-R M. 1371-4. technical characteristics for an automatic identification system using time-division multiple access in the VHF maritime mobile band", ITR-R, Tech. Rep., Apr. 2010.

(Continued)

*Primary Examiner* — Cynthia Britt
*Assistant Examiner* — Dipakkumar B Gandhi
(74) *Attorney, Agent, or Firm* — McDonnell Boehnen Hulbert & Berghoff LLP

(57) ABSTRACT

The invention relates to method and apparatus for improving the performance of communication systems using Run Length Limited (RLL) messages such as the existing Automatic Identification System (AIS). A binary data sequence is Forward Error Correction (FEC) coded and then the sequence is compensated, for example by bit-erasure, so that either bit-stuffing is not required, or a bit stuffer will not be activated to ensure that the coded sequence meets the RLL requirement. Various embodiments are described to handle different architectures or input points for the FEC encoder (Continued)

and bit erasure module. The bit erasure module may also add dummy bits to ensure a RLL compliant CRC or to selectively add bits to a reserve buffer to compensate for later bit stuffing in a header. Additional RLL training sequences may also be added to assist in, receiver acquisition.

17 Claims, 7 Drawing Sheets

(51) Int. Cl.
| | |
|---|---|
| H03M 13/31 | (2006.01) |
| H03M 13/00 | (2006.01) |
| H03M 5/14 | (2006.01) |
| H04L 21/00 | (2006.01) |
| H03M 13/09 | (2006.01) |
| H03M 13/11 | (2006.01) |
| H03M 13/23 | (2006.01) |

(52) U.S. Cl.
CPC ....... *H03M 13/31* (2013.01); *H03M 13/6325* (2013.01); *H03M 13/6356* (2013.01); *H04L 1/00* (2013.01); *H04L 1/0045* (2013.01); *H04L 1/0061* (2013.01); *H04L 1/0071* (2013.01); *H03M 13/09* (2013.01); *H03M 13/1102* (2013.01); *H03M 13/23* (2013.01)

(58) Field of Classification Search
CPC .. H03M 13/31; H03M 13/63; H03M 13/6325; H03M 13/6356; H03M 13/6362; H03M 13/09; H03M 13/1102; H03M 13/23; H03M 13/2957
See application file for complete search history.

(56) References Cited

U.S. PATENT DOCUMENTS

| | | | |
|---|---|---|---|
| 7,234,097 B1 | 6/2007 | Feng et al. | |
| 7,929,490 B1* | 4/2011 | Srinivas | H04W 68/02 370/328 |
| 2001/0034867 A1* | 10/2001 | Jaffe | H04B 7/18589 714/746 |
| 2002/0031123 A1* | 3/2002 | Watanabe | H04L 1/0041 370/389 |
| 2003/0018839 A1* | 1/2003 | Ishida | G06F 13/4059 710/71 |
| 2003/0117941 A1* | 6/2003 | Lundby | H04J 13/0048 370/209 |
| 2004/0013052 A1* | 1/2004 | Sako | G11B 27/034 369/30.05 |
| 2005/0120286 A1* | 6/2005 | Akamatsu | H03M 13/63 714/792 |
| 2005/0193318 A1* | 9/2005 | Okumura | G11B 7/1263 714/795 |
| 2005/0283702 A1* | 12/2005 | Wu | H03M 13/451 714/752 |
| 2009/0300466 A1* | 12/2009 | Yoshimura | G11B 20/1426 714/769 |
| 2010/0266071 A1* | 10/2010 | Chen | H03M 13/4146 375/341 |
| 2011/0013702 A1 | 1/2011 | Fujita | |
| 2011/0055665 A1* | 3/2011 | Lee | G11B 20/10055 714/769 |
| 2011/0289391 A1* | 11/2011 | Breiling | H03M 13/2732 714/786 |
| 2011/0304502 A1* | 12/2011 | Chen | G08G 3/02 342/352 |
| 2013/0290817 A1* | 10/2013 | Prevost | H03M 13/3994 714/792 |

OTHER PUBLICATIONS

Brink, Stephan ten et al., "Design of Low-Density Parity-Check Codes for Modulation and Detection", IEEE Trans. Commun., vol. 52, No. 4, pp. 670-678, 2004.

Brink, Stephan ten et al., "Design of Repeat-Accumulate codes for Iterative Detection and Decoding", IEEE Trans. Signal Process., vol. 51, No. 11, pp. 2764-2772, 2003.

Bane et al., "Run-Length-Limited Low-Density Parity Check Codes Based on Deliberate Error Insertion", IEEE Trans. Magnetics, vol. 40, No. 3, pp. 1738-1743, May 2004.

Bahl et al., "Optimal Decoding of Linear codes for Minimizing Symbol Error Rate", IEEE Trans. inform. Theory, vol. 20, pp. 284-287, Mar. 1974.

International Search Report dated Nov. 10, 2014 of PCT/AU2014/000832 filed Aug. 22, 2014.

X. Hu et al, "Improved Runlength Control When Using Low-Density Parity-Check Codes", Proc IEEE Global Telecommunications Conference, Nov. 1, 2006, GLOBECOM 2006, San Francisco, CA USA, XP055352425.

* cited by examiner

ENHANCED AUTOMATIC IDENTIFICATION SYSTEM

CROSS-REFERENCE TO RELATED APPLICATIONS

The present application is a U.S. National Phase Application pursuant to 35 U.S.C. § 371 of International Application No. PCT/AU2014/000832 filed Aug. 22, 2014, which claims priority to Australian Provisional Patent Application No. 2013903219 filed Aug. 23, 2013. The entire disclosure contents of these applications are herewith incorporated by reference into the present application.

INCORPORATION BY REFERENCE

The following publication is referred to in the present application and its contents are hereby incorporated by reference in its entirety:

Recommendation ITU-R M.1371-4. "Technical characteristics for an automatic identification system using time-division multiple access in the VHF maritime mobile band." ITR-R. Tech. Rep., April 2010.

The following co-pending patent application is referred in the present application and its contents are hereby incorporated by reference in its entirety:

PCT/AU2013/001501 titled "Digital Communication System" and filed on 20 Dec. 2013 claiming priority from Australian Provisional Patent Application Number 2012905588 titled "Digital Communication System" and filed on 20 Dec. 2012.

TECHNICAL FIELD

The present invention relates to telecommunications systems. In a particular form, the present invention relates to the International Maritime Organization (IMO) specified Automatic Identification System (AIS) which is a marine telecommunications system for the tracking and collision avoidance of ships and the like.

BACKGROUND

The AIS is an IMO mandated system for automatically tracking ships by other ships, base stations or satellites for maritime navigation, safety and security. Vessel-mounted AIS transmitters send out AIS messages, including location information, etc., in regular time intervals. AIS receivers on ships, base stations or satellite try to correctly detect these messages. The AIS is designed for non-coherent detection. This allows for simple receiver structures at the cost of high signal-to-noise ratios (SNR) and high retransmission rates for reliable communication.

The technical characteristics of the AIS system are set out in Recommendation ITU-R M.1371-4. "Technical characteristics for an automatic identification system using time-division multiple access in the VHF maritime mobile band," ITR-R, Tech. Rep., April 2010 (hereinafter "the AIS specification") which is hereby incorporated by reference in its entirety.

Referring now to FIG. 1 there is shown a block diagram of a compliant AIS transmitter 100 that is used to transmit an AIS compliant message having a general field structure 10 shown in FIG. 2. The AIS specification defines a range of AIS message types that are binary sequences typically comprising one or more header fields in a message header portion followed by a data portion. The transmitter is provided 110 with an AIS message as a binary data sequence for insertion in a data payload field 20. The data payload field can have a variable length up to 168 bits. Longer messages can be split over several transmission slots. A cyclic redundancy check (CRC) block 120 calculates a 16 bit CRC value from the data portion in the AIS message 110 and the CRC value is appended to the AIS message in a 16 bit Frame Check Sequence (FCS) field 29. The FCS field will also be referred to as the CRC field (labelled FCS (CRC) in FIG. 2).

The AIS specification defines that the AIS message, and CRC are to be run length limited (RLL) to a maximum run of five consecutive "1" binary states by bit-stuffing. A bit stuffing module 130 scans the AIS message and CRC value and inserts a 0 binary state after five consecutive 1 binary states. The bit stuffed data payload field 20 and CRC field 30 are then wrapped in 8 bit start field 16 and an 8 bit end field 18, each field containing an identical 8 bit flag sequence (01111110). The flag sequence is not subject to bit stuffing even though it contains a run of six 1's. A training sequence field 14 comprising a 24 bit sequence of alternating 0's and 1's is prepended before the start flag for receiver synchronisation. A start buffer 12 is prepended before the training sequence field 14, including an 8 bit ramp-up field. An end buffer 30 is appended after the end flag field 18. The end buffer is normally 24 bits long and comprises a 4 bit bit-stuffing field 32, a 12 bit distance delay field 34, a 2 bit repeater delay field 36 and a 6 bit synchronisation jitter field 38. Note that the start buffer and end buffer are not subject to bit-stuffing.

A packet 10 is thus formed from an AIS message by adding a CRC, bit-stuffing, start and end flags, a training sequence, and start and end buffers. The packet 10 has a nominal length of 256 bits. Forming the packet can be performed by a framing block 140 which may also select the slot or slots the packet is to be transmitted in. The packet may be sent in a single slot or spread over several slots. The AIS specification defines that a transmitter (or transmitting station) may occupy a maximum of five consecutive slots for one continuous transmission, in which case only a single application of the overhead (ramp up, training sequence, flags, FCS, buffer) is required for a long transmission packet. Taking into account the 16 bit FCS field, the lengths of the data fields in the packet are 172, 428, 684, 904 and 1196 bits, respectively.

After framing, the packet is passed to a Non Return Zero Inverted (NRZI) Encoder module 150 in which a 0 at the input changes the level at the output and a 1 leaves the output unchanged. Finally this sequence is fed to a Gaussian Minimum Shift Keying (GMSK) modulator 160 with a (maximum) parameter BT=0.4. Note that the state of the NRZI encoder and of the GMSK modulator at the beginning of the packet are not specified in the AIS specification.

While the AIS system is generally effective, common sources for misdetection of an AIS signal are (a) transmission errors due to noise or other channel disturbances, and (b) interference by other AIS devices that are simultaneously transmitting.

One approach that could potentially be used to improve the AIS system would be the adoption of forward error correcting (FEC) coding principles (the AIS specification states that FEC is not used). In forward error correction (FEC) coding, redundant data is transmitted in addition to the actual data. This redundancy is exploited by the receiver to correct transmission errors. The advantages where this approach is effective are dramatically reduced error rates. The combination of FEC coding and modulation is referred to as coded modulation. FEC coding provides low error rates, while modulation provides high throughput in the case of higher-order modulation and/or bandwidth efficiency in the case of modulation with memory. Examples of coded modulation include trellis-coded modulation, multi-level-coded modulation, bit-interleaved coded modulation, and state-of-the-art schemes like LDPC-coded modulation and IRA-coded modulation.

However, simply FEC encoding the data in the AIS message given to the transmitter (ie entry point 4 in FIG. 1) and providing additional training sequences is not possible due to the following reasons. First, and most importantly, the bit-stuffing step would add bits to the codeword and thus make soft FEC decoding prohibitively complex, if not infeasible. In addition the CRC would be transmitted uncoded whilst the data would be FEC coded, and thus the CRC could not be used to detect errors. Further, the NRZI would need to be soft-decoded for high-performance iterative decoding and the NRZI/GMSK state would need to be well-defined at the beginning of any training sequence to be used for acquisition. In addition, it is desirable that the transmitter structure be designed such that existing AIS hardware and software can be reused, and such that the resulting waveform is AIS standard compliant.

There is thus a need to provide methods and apparatus improving the effectiveness of the AIS system, or at least provider users with a useful alternative.

SUMMARY

According to a first aspect, there is provided a method for generating a message for transmission in a system that requires the message to be run length limited (RLL) to a run of n first binary states by bit-stuffing, wherein bit-stuffing comprises insertion of a second binary state after the $n^{th}$ first binary state, the method comprising:

coding at least a data portion of a binary sequence for transmission using a forward error correction (FEC) code to generate a FEC coded portion of the binary sequence;

bit erasing one or more bits in at least the FEC coded portion to compensate for a run of n first binary states in the FEC coded portion of the binary sequence so that the FEC coded portion is RLL without requiring the insertion of additional bits; and providing the binary sequence to a transmitter for modulation and subsequent transmission, wherein a bit stuffing step may be performed after the bit erasing step.

In one form, either no bit stuffing is performed, and at least the data portion of the binary sequence is run length limited, or a bit stuffing step is performed on at least the data portion of the binary sequence before the coding step, and bit erasing comprises setting the $n+1^{th}$ bit after a run of n first binary states to the second binary state. In one form, bit erasing comprises setting the $n^{th}$ bit in a run of n first binary states to the second binary state. In one form, the following steps after the bit erasing step (but before a bit-stuffing step if a bit stuffing step is performed) are performed: adding a set of m dummy bits to the FEC coded portion; generating a cyclic redundancy check (CRC) value for the FEC coded portion and appended m dummy bits; and checking if the CRC value includes a run of n first binary states and if the CRC value includes a run of n first binary states then repeating the adding, generating and checking steps wherein each time the adding step is repeated a different set of m dummy bits are added. In one form if the binary sequence further comprises a header portion preceding the data portion, and the bit stuffing step is performed on the header portion and the FEC coded portion, and the method further comprises the following steps prior to the coding step: determining the maximum number of bits i that a bit-stuffer could add to the header portion based upon the size of the header portion; checking the header portion and calculating the number of bits j that the bit-stuffing step will add to the header portion; and inserting k=i−j buffer bits after the header portion. In one form where a bit stuffing step is performed after the bit-erasing step, and the bit-erasing step implements selective bit erasing, then if the $n+1^{th}$ bit after a run of n first binary states is equal to the first binary state, then the $n^{th}$ bit is set to the second binary state, and if the $n+1^{th}$ bit after a run of n first binary states is equal to the second binary state, then the $n+1^{th}$ bit is removed from the binary sequence. In one form, the coding step further comprises generating a cyclic redundancy check (CRC) data value from the data portion and coding the data portion and the CRC data value to generate the FEC coded portion.

In one form, the method further comprises adding a trellis termination sequence prior to an end flag, wherein the trellis termination sequence is a sequence that places a joint NRZI/GMSK trellis in the transmitter in a defined state prior to the start of the end flag to enable use of the end flag as a further training sequence and where the trellis termination sequence is run-length limited. In a further form, the joint NRZI/GMSK trellis in the transmitter has a memory of p bits and the trellis termination sequence is a p bit sequence, and the last p bits prior to the end flag are reserved for the trellis termination sequence. In one form, the method further comprises inserting a training sequence into the data portion or FEC coded portion, wherein the training sequence is not FEC encoded and is located between a first FEC encoded portion and a second FEC encoded portion. In a further form, the method further comprises inserting a trellis termination sequence prior to the inserted training sequence, wherein the trellis termination sequence is a sequence that places a joint NRZI/GMSK trellis in the transmitter in a defined state prior to the start of the training sequence and where the trellis termination sequence is run-length limited. In a further form the joint NRZI/GMSK trellis in the transmitter has a memory of p bits and the trellis termination sequence is a p bit sequence and the last p bits of the FEC coded sequence before an inserted training sequence are reserved for the p bit trellis termination sequence. In one form, the transmitter transmits the binary sequence as a series of messages in a plurality of slots. In one form, the binary sequence is an Automatic Identification System (AIS) compliant message for transmission in a AIS system where n=5. In one form the binary sequence is an Automatic Identification System (AIS) compliant message for transmission in a AIS system where n=5 and the AIS compliant message has an AIS message type of 6, 8, 25 or 26. The above forms relating to adding trellis termination sequences and/or training sequences may also be performed instead of FEC coding and bit erasure.

According to a second aspect, there is provided a method for receiving an Automatic Identification System (AIS) compliant message incorporating forward error correction (FEC) coding, the method comprising:

receiving a message incorporating a coded portion encoded using a FEC coded; and iteratively demodulating and decoding the received message by iterating between a soft demodulator and a soft decoder via an intermediate interleave/de-interleaver module until a termination criteria is fulfilled, or if a CRC data value is present in the coded portion of the message, then if the decoded sequence passes a CRC check using the decoded CRC data value.

In one form, the soft demodulator performs GMSK demodulation and NRZI decoding on a joint trellis. In one form the soft decoder performs Run Length Limited (RLL) decoding using a RLL decoder module followed by FEC decoding using a FEC decoder module wherein the RLL decoding is performed using a trellis representation of a RLL encoder. In one form the RLL decoding is performed using the BCJR algorithm. In one form, the soft decoder iterates between the RLL decoder module and the FEC decoder module. In one form, iterating between the RLL decoder module and the FEC decoder module comprises providing a demodulated sequence and a-priori information to the RLL decoder, and RLL decoder generates a RLL output, wherein the a-priori information provided to the RLL decoder is removed from the RLL output, and is interleaved before being passed to the FEC decoder as a-priori information, and the FEC decoder generates a FEC output, wherein the apriori information provided to the FEC decoder is removed from the FEC output, and is de-interleaved before being passed to the RLL decoder as a-priori information, and wherein iteration is terminated after a stopping criterion is met, and the FEC decoder then provides the final FEC output to the next receiver stage. In one form, the NRZI module and GMSK modulator are started in a well defined state when a ramp-up portion of a message is transmitted, and a plurality of input bits are provided to the NRZI module during ramp-up so as to define the state of the joint NRZI/GMSK trellis at the start of a start flag, and the receiver uses the start flag as an additional training sequence. In one form, the joint NRZI/GMSK trellis has a memory of p bits, and the last p bits of the codeword in the received message are reserved for p dummy bits to define the state of the joint NRZI/GMSK trellis before the start of an end flag, and the receiver uses the end flag as an additional training sequence. In one form, the joint NRZI/GMSK trellis has a memory of p bits, and the transmitted message includes an additional training sequence within the message, and the last p bits of the codeword in the received message prior to the additional training sequence are reserved for p dummy bits to define the state of the joint NRZI/GMSK trellis before the start of the additional training sequence. In one form, the message includes a non coded training sequence after a coded portion of the message to assist in acquisition of the signal, and the receiver performs acquisition by considering each possible waveform for the training sequence resulting from each of the possible starting trellis states, and selects the most likely waveform for further demodulation. In one form, the NRZI module and GMSK modulator module are placed in a well defined state prior to an additional training sequence, and wherein one or more of the start flag, end flag, or an training sequence within the data portion of a received message are used as additional training sequences to assisting in acquisition of the received message.

Corresponding transmitters and receivers that implement the above methods may also be provided, as well as modules for integration with AIS compliant transmitters and receivers may also be provided. An AIS compliant system that uses these transmitters and receivers, or AIS transmitters and receivers including the integrated modules may also be provided.

BRIEF DESCRIPTION OF DRAWINGS

Embodiments of the present invention will be discussed with reference to the accompanying drawings wherein.

In the following description, like reference characters designate like or corresponding parts throughout the figures.

DESCRIPTION OF EMBODIMENTS

Embodiments of methods and apparatus to efficiently improve the performance of the existing AIS system by adding forward error correction (FEC) coding and advanced acquisition whilst ensuring that the transmit waveform stays within the requirements imposed by the AIS specification will now be described. Adding FEC coding to the AIS waveform can greatly enhance the performance of AIS by allowing for (a) error correction and (b) iterative multi-user decoding. A range of FEC codes may be implemented including traditional techniques like convolutional codes and algebraic block codes, as well as modern codes like turbo codes, low-density parity-check (LDPC) codes and irregular repeat-accumulate (IRA) codes. Codes of the latter classes represent the state-of-the-art and can approach the fundamental limits of communication.

The AIS standard defines various message types. AIS Message type 6, 8, 25 and 26 allow for transmission of binary data and these message types may be used to carry FEC-coded data with additional training sequences for improved decoding and acquisition. Alternatively, a new message type may be defined. As discussed above, AIS messages may extend over one to five consecutive slots. Longer packets are particularly attractive for the enhanced AIS system, as the performance of FEC codes increases with the code length.

We are interested in extending the AIS system within the current standard. To do so, we use the AIS message types 6, 8, 25 and 26, which may carry any binary data, or a new message type, which is more efficient. In our case, this binary data will contain the FEC encoded data and possibly further training sequences for improved decoding and acquisition. The proposed methods may be applied to single-slot messages or long messages (two to five slots). Longer messages are preferable, as the performance of FEC codes increases with the code length. The data to be transmitted may be source-coded.

Figure 3:
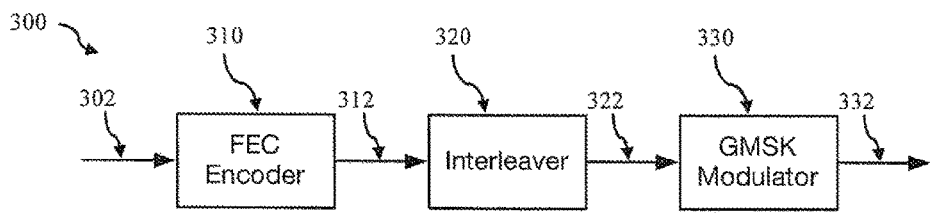
FIG. 3 is a block diagram of a transmitter for FEC coded GMSK modulation according an embodiment.
Figure 4:
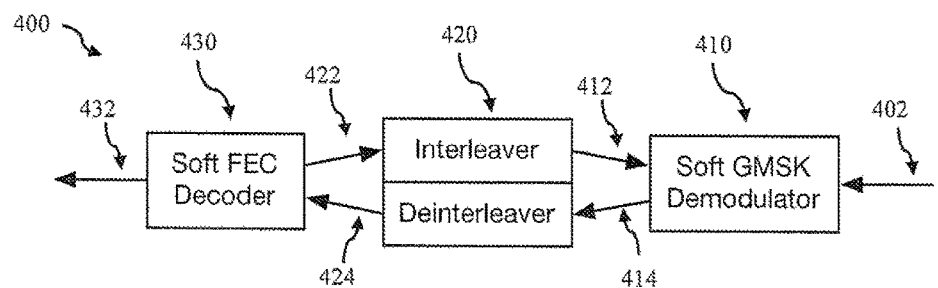
FIG. 4 is a block diagram of an iterative receiver for FEC coded GMSK modulated transmission according an embodiment.

To extend the AIS system we propose to modify the transmitters and receivers as described below. The AIS specification uses GMSK, that is, a modulation scheme with memory and a recursive encoding structure. To enhance it with FEC coding, bit-interleaved coded modulation is an appropriate choice. Referring now to FIGS. 3 and 4, there are shown functional breakdowns of a transmitter 300 and a receiver 400 respectively. FIG. 3 is a block diagram of a transmitter for FEC coded GMSK modulation according an embodiment, and FIG. 4 is a block diagram of an iterative receiver for FEC coded GMSK modulated transmission according an embodiment. As shown in FIG. 3, in transmitter 300) the data bits are encoded by the FEC encoder 310 into a codeword, interleaved 320 and then fed into the GMSK modulator 330. The receiver 400 as shown in FIG. 4, typically operates in an iterative fashion where the channel observations are demodulated into soft estimates of the code bits 410, de-interleaved 420, soft decoded by the FEC decoder 430 with the results then fed back to the soft demodulator 410. This decoding process is iterated until a codeword is found or any other termination criterion is achieved. The FEC decoder then provides the estimated data bits. Non-iterative processing is also possible. The advantages of FEC coding in connection with GMSK have been demonstrated in PCT/AU2013/001501. Therefore, FEC coding with enhanced acquisition and coherent demodulation, as illustrated below will greatly improve the performance of the AIS.

Figure 14:
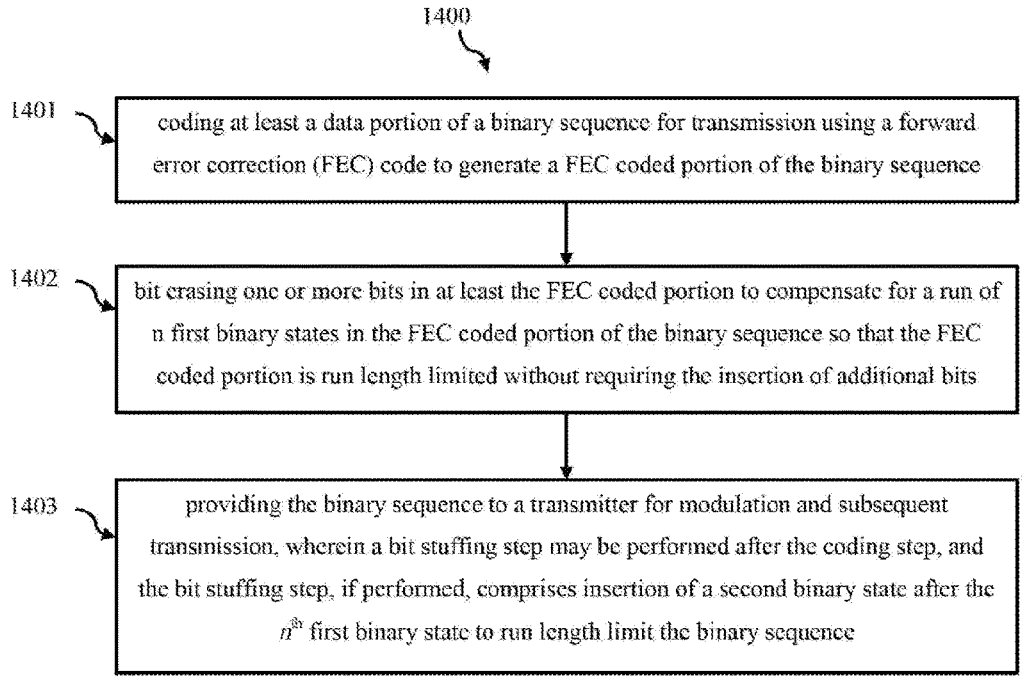
FIG. 14 is a flow chart of a method for generating a message for transmission in an AIS system according to an embodiment.

FIG. 14 is a flow chart 1400 of a method for generating a message for transmission in a system such as the AIS system, that requires the message to be run length limited (RLL) to a run of n first binary states by bit-stuffing, wherein bit-stuffing comprises insertion of a second binary state after the n$^{th}$ first binary state.

The method comprises a coding step 1401 that comprises coding at least a data portion of a binary sequence for transmission using a forward error correction (FEC) code to generate a FEC coded portion of the binary sequence. A bit erasing step 1402 is then performed by bit erasing one or more bits in at least the FEC coded portion to compensate for a run of n first binary states in the FEC coded portion of the binary sequence so that the FEC coded portion is RLL without requiring the insertion of additional bits (cg by a bit stuffer). Finally at step 1403, the binary sequence is provided to a transmitter for modulation and subsequent transmission. A bit stuffing step may be performed, and if performed, it may be performed after the bit erasing step and may be performed on a portion of the binary sequence to run length limit (RLL) the portion (for example the data portion of the binary sequence). Bit-stuffing is performed by insertion of a second binary state after a run of n first binary states. For example in AIS the first binary state is a 1, and the second binary state is a 0 (in other systems this could be reversed) and the binary sequence is run length limited to 5 1's (n=5) so that a sequence 11111X becomes 111110X (ie grows by 1 bit through the insertion of a 0 before the X).

In the above method the bit erasing step 1402 pre-compensates for any bits inserted by bit-stuffing to ensure that the FEC coded portion is run length limited and that the length of the FEC coded portion in the binary sequence provided to the transmitter has the same length of the FEC coded portion after the coding step. That is the compensation is performed so that either bit stuffing is not required, or if a bit stuffer is present after the bit-erasing module, the bit stuffer will not be activated as a result of FEC coding. Note the bit erasing does not necessarily mean that the bits are removed (or punctured) from the bit stream or sequence (although in certain cases described below they may be). Rather the values are erased or set to 0, independent of their actual value. Thus the bits that are zero effectively stay the same (the 0 is erased to 0), and the bits that are a 1 are erased (or flipped) to zero. Thus in this context bit erasing can be understood as conditional bit flipping, zeroing or resetting.

The detailed description below describes several ways to add FEC coding and improved acquisition to the AIS waveform, depending on the transmitter hardware and/or software used. This allows modification of an existing AIS transmitter for example by accessing an input (or output) point of an standard module in an AIS transmitter and adding a FEC encoder and bit erasure module, and/or a training sequence module. Alternatively a transmitter that is AIS compliant could be developed that incorporates a FEC encoder and bit erasure module, and/or a training sequence module. Alternatively an existing (standard) AIS transmitter could be used by providing the transmitter with a bit sequence that has been carefully constructed. For example rather than provide a data portion or AIS message for transmission, a FEC encoder and bit erasure module and/or a training sequence module could first process a data portion of standard AIS message so that the resulting sequence that is provided to the AIS transmitter is either already run length limited to avoid activation of the bit stuffer in the AIS transmitter, or modified to precompensate for any bit stuffing that would be performed by the AIS transmitter. That is, the input sequence is carefully designed or generated so that a bit stuffer is conditionally activated so as not to adversely affect the FEC coding.

Figure 1:
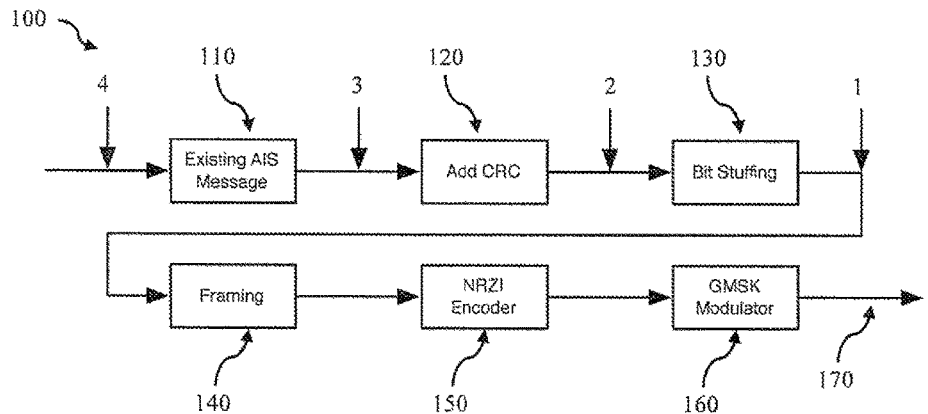
FIG. 1 is a block diagram of an AIS compliant transmitter.

FIG. 1 indicates various entry points for adding FEC coding according to the various embodiments of the above method, and will now be described. For Entry Points 1, 2 and 3, we assume that a new AIS message is used, as this gives more flexibility. For Entry Point 4, we assume that the existing message types 6, 8, 25 or 26 are employed. However if desired, the message types 6, 8, 25 and 26 may also be applied for Entry points 1, 2, and 3, using the methods described below regarding entry point 4.

Figure 2:
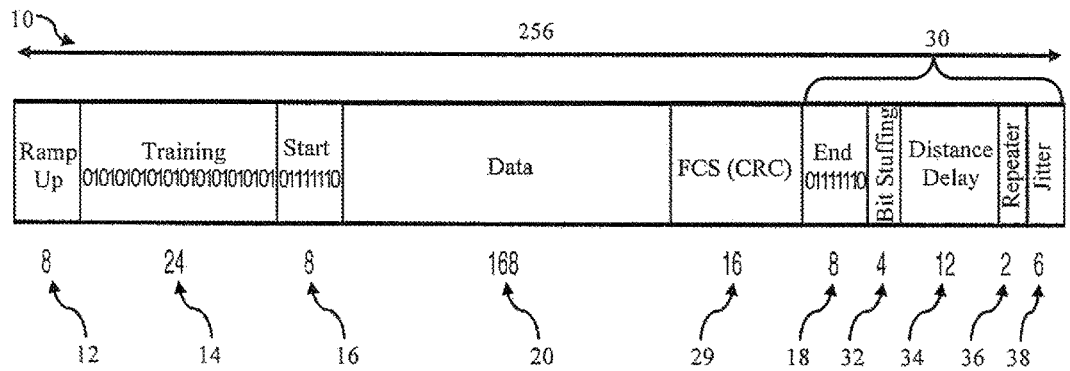
FIG. 2 is a schematic diagram of the general field structure of standard AIS packet for transmission in a single slot.

The following explanations assume the default message length with a data portion of 182 bits (168 data bits plus 16 CRC bits). For long messages (up to five slots), the lengths of the data has to be extended correspondingly (to 428, 684, 904 and 1196 bits, respectively). The shaded fields in FIG. 2 indicate the portion of the binary sequence that is subject to bit stuffing. As outlined above, bit erasure is performed to compensate for the effects of bit stuffing to allow the inclusion of FEC coding whilst still maintaining an AIS compliant packet—that is a binary sequence which is run limited. The choice of the bit erasure to use depends upon the entry point and message structure.

First Embodiment—Entry Point 1—after AIS CRC and Bit Stuffing but Before Framing Consider that the AIS transmitter can be accessed before framing (entry point 1 in FIG. 1). In this case, a field of length 188 bits is available for the channel code, comprising the data field (168 bits), the CRC field (16 bits), and the bit-stuffing field (4 bits). The bit sequence has to be run-length limited such that there are no more than five consecutive ones, in order to generate an AIS-compliant waveform.

Figure 5A:
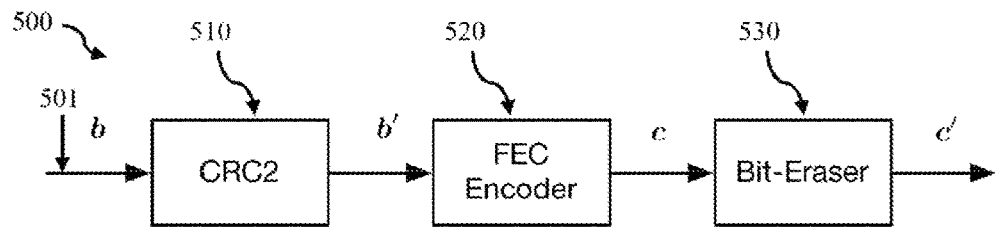
FIG. 5A is a block diagram of a FEC encoder structure in a transmitter according an embodiment.

FIG. 5A is a block diagram of a FEC encoder structure in a transmitter according an embodiment. This can be used for entry point 1 in FIG. 1.

Figure 5B:
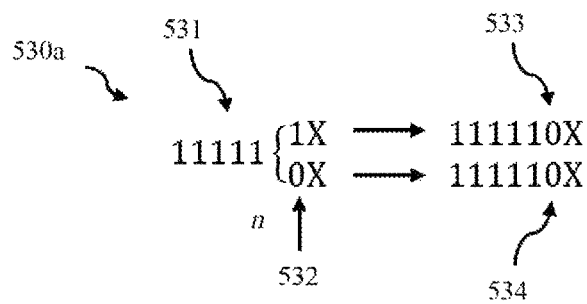
FIG. 5B is a schematic diagram of a first bit erasure scheme according an embodiment.

We begin at input 501 with binary data sequence b for transmission. For the case of entry point 1, the binary data sequence b has a data portion 20. The binary data b to be transmitted may be appended by a data CRC value (optional) generated from a CRC check of the data portion in sequence b by CRC2 module 510 forming the sequence b'. We denote this CRC by CRC2, or refer to it as a data CRC value, to distinguish it from the CRC specified in AIS (which we may denote as AIS-CRC in the following), as depicted in FIG. 1. The sequence is then encoded into the FEC codeword c by FEC encoder module 520. FEC encoding the data may generate runs of 1's so that the FEC encoded data is not run length limited in which case if transmitted, the message would not be RLL compliant. However simply passing the FEC coded data through a bit-stuffer module will add further bits and significantly increase the decoding complexity in the receiver which is highly undesirable. Thus instead of bit stuffing the FEC coded sequence (the codeword) to ensure it is RLL compliant, the FEC coded sequence is fed to a bit-eraser module 530 to yield the run-length limited sequence (run-length limited codeword) c'. This procedure ensures that the run-length constraint is fulfilled. Note that as opposed to bit-stuffing, where the zero is inserted after a run of five 1's, bit erasing does not change the length of the bit sequence and works as follows: the output bit of the bit-erasing unit is equal to the input bit, unless the previous n input bits (excluding the current input bit) are 1; in this case the output bit is set to 0 independent of the value of the input bit. That is, bit erasing comprises setting the n+1$^{th}$ bit after a run of n first binary states to the second binary state. FIG. 5B is a schematic diagram 530a of a first bit erasure scheme according an embodiment in which n=5. An input sequence 531 comprises 5 1's. After the nth 1 the next bit may be a 1 or 0 followed by some other bit X 532. In each case, the bit eraser sets the value of the next bit (ie n+1th bit) to 0 and thus generates identical output sequences 533 or 534 regardless of the value of the next bit (ie 111111X→111110X, and 111110X→111110X). This sequence thus has the appearance of being bit stuffed, even though no bit stuffing has occurred and ensures that the coded sequence is RLL and that the length of the codeword sequence is not changed. Once the sequence is bit erased, it is framed, optionally interleaved, NRZI encoded, GMSK modulated and then transmitted. As discussed below, additional training sequences may also be added (which may also require modification of the end of the codeword as discussed below).

We now consider the receiver for a transmission using the above bit erasure method. To take full advantage of the coded GMSK system, the receiver iterates between the soft-demodulator and the soft FEC decoder, for example as described in PCT/AU2013/001501. GMSK demodulation and NRZI decoding are preferably performed in a single soft-demodulator on the joint trellis (see soft-decoding of the NRZI below and PCT/AU2013/001501). The bit-erasing performed at the transmitter side is ignored, and any errors introduced by the bit-eraser are treated as transmission errors by the FEC decoder. This has to be taken into account in the design of the FEC code. Decoding is terminated if a suitable termination criterion is fulfilled, see PCT/AU2013/001501, or if in the presence of a data CRC value (CRC2), the decoded sequences passes the CRC check (Note that this is the optional additional CRC "CRC2" and not the CRC as defined by AIS). Further details about bit-erasing module 530 and the corresponding module at the receiver side are discussed below.

Second Embodiment—Entry Point 2: Before Bit-Stuffing

Consider that the AIS transmitter can be accessed before bit-stuffing (entry point 2 in FIG. 1). In this case, it is desirable to feed the bit-stuffing unit with a sequence that does not require bit-stuffing, such that the length of the output sequence is fixed and not variable. This reduces the complexity in the receiver—soft-decoding of a bit-stuffer is possible but complex and with limited benefit as discussed below. A field of length 188 bits is available for the channel code, as in the previous case.

Figure 5C:
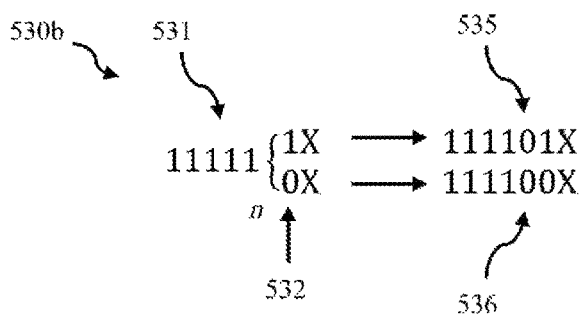
FIG. 5C is a schematic diagram of a second bit erasure scheme according an embodiment.

There are two approaches for the bit eraser module 530 in the transmitter:

Transmitter 1 implementing bit eraser module 530b as illustrated in FIG. 5C:

The transmitter structure is the same as in the previous case with one difference: after any sequence of four consecutive ones, the bit-eraser sets the following bit to zero. That is the bit erasing step comprises setting the n$^{th}$ bit in a run of n 1's to 0. This is illustrated in FIG. 5C. After the nth 1 the next bit may be a 1 or 0 followed by some other bit X 532. In each case, the bit eraser sets the value of the nth bit to 0 and generates output sequences 535 or 536 (ie 111111X→111101X, and 111110X→111100X). This ensures the length of the codeword sequence is not changed. This is effectively the same operation as the case above (illustrated in FIG. 5B) but with n replaced by n−1.

Figure 5D:
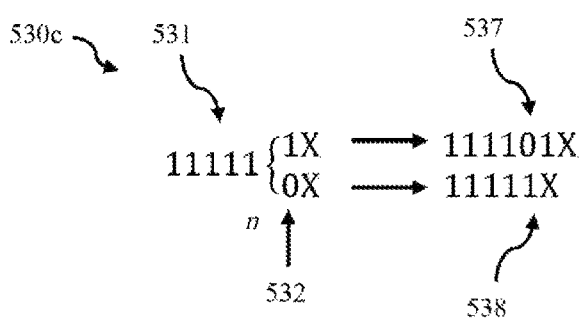
FIG. 5D is a schematic diagram of a third bit erasure scheme according an embodiment.

Transmitter 2 implementing bit eraser module 530c as illustrated in FIG. 5D:

The transmitter structure is the same as in the previous case. However, the run-length constraint is fulfilled by performing conditional bit erasing. If there are five consecutive ones and the next bit is also a one, replace the fifth one with a zero, i.e., 'erase' it. If there are five consecutive ones and the next bit is a zero, delete this zero, i.e., remove it from the bit stream, as the AIS bit stuffer 130 will re-insert this zero later on. That is if the n+1$^{th}$ bit after a run of n 1's is a 1, the n$^{th}$ bit is set to 0 and if the n+1$^{th}$ bit after a run of n 1's is equal to 0, then the n+1$^{th}$ bit (the 0) is removed from the binary sequence. Note that this approach halves the average number of errors introduced by the bit-eraser as compared to the previous first approach. This is illustrated in FIG. 5D. After the nth 1 the next bit may be a 1 or 0 followed by some other bit X 532. In the case of the next bit being a 1, the nth bit is set to 0 in output sequence 537 (ie 111111X→1111101X). In the case of the next bit being a 0 the n+1th bit is removed from the output sequence 538 (as this will be added back in by the bit stuffer), which differs from 537 (111110X→11111X).

Receiver: The receiver structure is the same as in the previous section.

The bit-eraser at the transmitter makes sure that the bit-stuffer either stays inactive, or any bit-stuffing is pre-compensated for by the bit eraser, so that the length of the generated codeword is unchanged by passage through the bit-stuffer. When limiting the maximum length of runs of ones to 5 (as for entry point 1), the probability for erasing a bit is about 0.0159; when limiting the maximum length of runs of ones to 4 (as for entry point 2), the probability for erasing a bit is about 0.0323. The corresponding probabilities of introducing a bit error by these procedures are given by these values divided by two. Thus the present method introduces up to twice as many bit errors as the previous method (entry point 1). This has to be taken into account in the design of the FEC code.

Third Embodiment—Entry Point 3: Before CRC

Consider that the AIS transmitter can be accessed before the AIS-CRC (entry point 3 in FIG. 1). In this case, the data is FEC encoded but the AIS-CRC is not, and thus the AIS-CRC cannot be used for error detection. As in the previous case, we want to design the input sequence to the bit-stuffer such that the bit-stuffing does not produce any additional bits. In the present case, we can only control the input sequence to the AIS-CRC. Thus we need to reserve m=16 dummy bits to drive the output of the AIS-CRC (which has length 16 bits) to a value such that the run-length constraint is fulfilled. Correspondingly, a field of length 156 bits is available for the channel code, comprising the data field (168 bits) and the bit-stuffing field (4 bits), minus dummy bits to fulfil the run-length constraint after the CRC (m=16 bits).

Figure 5E:
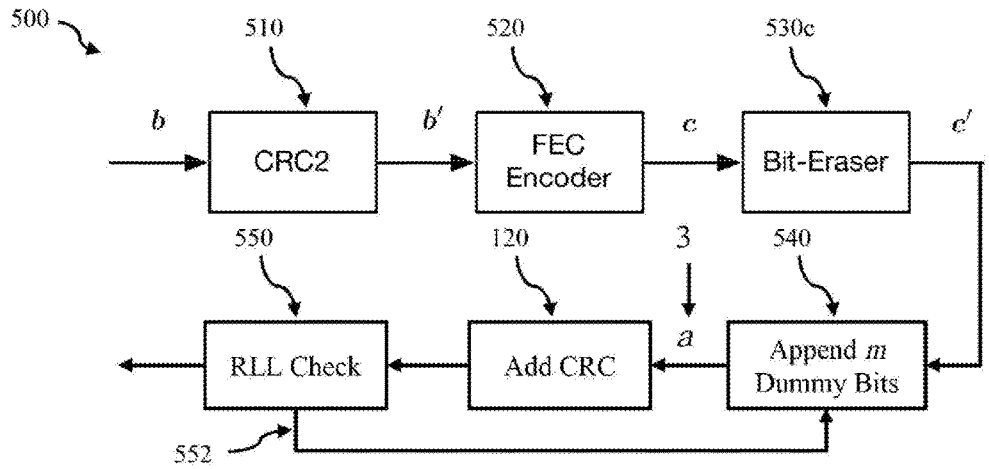
FIG. 5E is a block diagram of a FEC encoder architecture in a transmitter according an embodiment.

Transmitter: FIG. 5E is a block diagram of a FEC encoder architecture according to this embodiment. In this embodiment the architecture of FIG. 5A is modified with additional modules to perform the adding, CRC generation and checking steps after the bit erasing step but before the bit-stuffing step. Thus as before, the data b to be transmitted may be appended by a CRC (optional), is encoded by an FEC code into the codeword c and then fed to the bit-eraser which in this case is the bit eraser module 530b that sets a bit to zero after a run of four ones (although bit eraser module 530c could also be used), yielding the bit erased sequence c', this is identical to the previous cases. At the end of this sequence c', dummy bit adder module 540 appends m dummy bits d to generate the sequence a=[c', d]. Note that instead of appending, the dummy bits may be added (inserted) at other known (or predetermined) positions in the sequence c'. Next the AIS CRC module 120 is used to generating a AIS CRC value for the FEC coded portion and the appended m dummy bits (ie generation of sequence a is provided at entry point 3 in FIG. 1). A RLL checking module 550 then checks (or tests) if the CRC value includes a run of n 1's to check if the output sequence is still run length limited. If the CRC value includes a run of n 1's (ie is not RLL compliant) then an instruction 552 is sent back to dummy bit adder module 540 to repeat the adding, generating and checking steps. Each time the adding step 540 is repeated a different set of m dummy bits are added (or appended) to generate a different CRC value (this may allow adding the same bits but in different locations). That is if the resulting sequence does not fulfil the run-length constraint, i.e., does have runs of ones longer than four, different values for the dummy bits are chosen and the output of the CRC unit is computed again. This procedure is repeated until the run-length constraint is fulfilled. Then, the sequence a is fed into entry point 1. Note that in this way, the bit-stuffer is never activated, as desired. Other methods to determine the values of the dummy bits dare possible, such as exploiting the algebraic properties of the CRC code and computing the dummy bits, or using a look-up table for the dummy bits. Note that with m=16 dummy bits, any desired value of the AIS-CRC can be achieved, and thus the run-length constraint can always be fulfilled. In other embodiments some other method may be used to allow a smaller number of bits to be inserted.

Receiver: The iterative receiver structure is the same as in the previous section. Soft information about the AIS CRC bits is not exchanged between the soft-decoder and the soft NRZI/GMSK demodulator, i.e., the AIS CRC bits are not used for the decoding process.

Fourth Embodiment—Entry Point 4: Use of Existing AIS Message Type

Figure 6A:
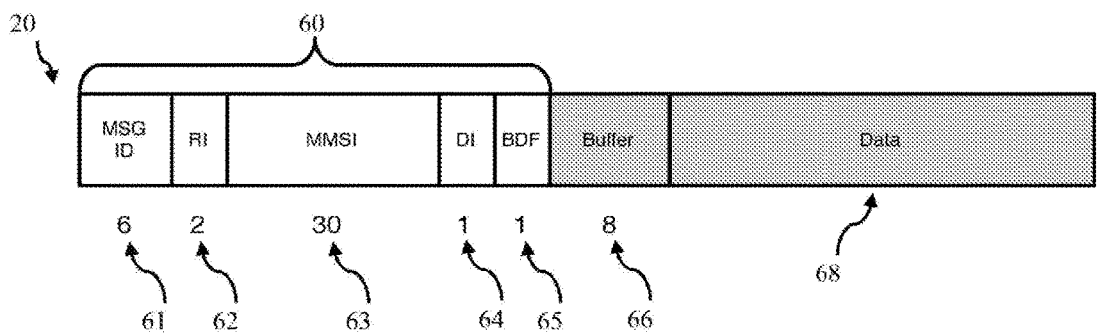
FIG. 6A is a schematic diagram of the field structure of an AIS compliant message comprising a header portion, a buffer portion and data portion according to an embodiment.

Consider that existing AIS message types 6, 8, 25 or 26 are used (entry point 4 in FIG. 1). Note that this is the most general scenario and may be applied to any existing AIS transmitter. FIG. 6A is a schematic diagram of the field structure of an AIS compliant message (such as type 25 or 26) comprising a header portion 60, and a data portion 68. In these messages, the actual binary data is prepended by a header portion 64) (or header field). In the case of AIS message types 25 or 26, the header portion 60 comprises a message ID (6 bits) 61, the repeat indicator (2 bits) 62, the source ID (30 bits) 63, the destination indicator (1 bit) 64, and the binary data flag (1 bit) 65, giving a header portion (or field) 60 with an overall size of 40 bits, as shown in FIG. 6A. This reduces the number of bits available for channel coding and additional training. In this embodiment, we add a 8 bit buffer field 66. The shaded fields 66 68 for buffer and data (respectively) together are the accessible binary data for FEC encoding. However the entire message 20, including header portion 60, buffer portion 66 and data portion 68, will be subject to bit stuffing.

The measures to be taken in this case are the same as in the previous case (Entry Point 3). In addition, special care has to be taken, as the 40 header (or parameter) bits may activate the AIS bit-stuffer. This would lead to a variable length packet and a variable start position of the codeword, both of which are not desirable. The following method guarantees a fixed length packet and a well-defined start of the codeword.

The method described here is using the example case of binary message types 25 and 26 in broadcast mode, which have a header of length 40 bits. The method is easily adapted for use with other binary message types, which may have headers of different length. Given 40 bits, the bit-stuffer may generate a maximum number of 8 additional bits. In order to obtain a well-defined length of the sequence, we use the first 8 bits of the data field as a buffer. Assuming that the transmit parameters are known, the first 40 bits are known, and thus it can be determined how many bits the bit-stuffer will introduce. The same number of bits is then removed from the buffer. The remaining buffer and the data (see FIG. 6A) are then used for the data field in the AIS message (25 or 26). As a result, the actual data always starts with bit number 49 (counted from the first bit of the message ID), and the overall message has a fixed length, as desired.

Figure 6B:
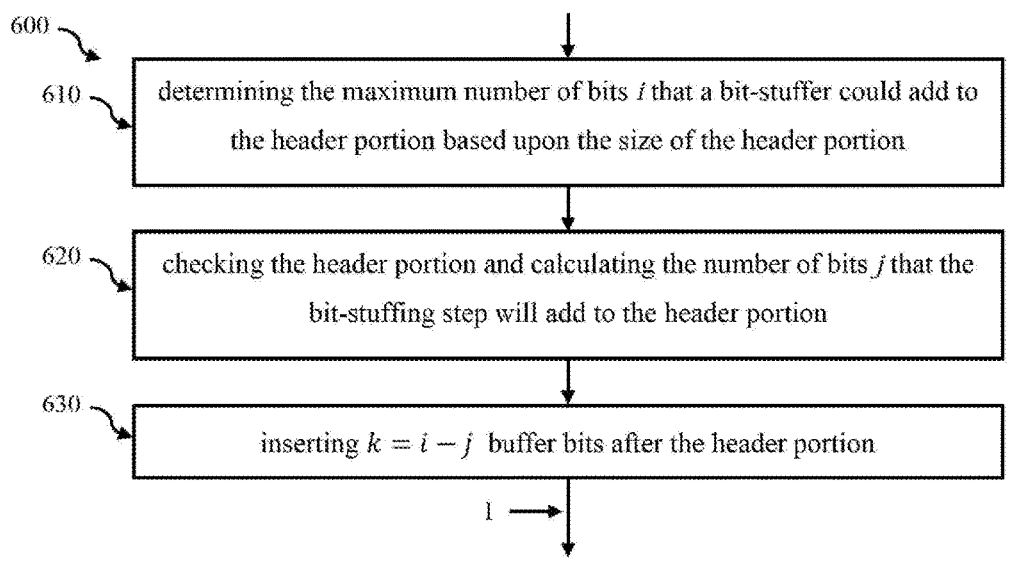
FIG. 6B is a flow chart of a bit erasure method for compensating for bit stuffing for use with the field structure shown in FIG. 6A according to an embodiment.

FIG. 6B is a flow chart of this method (eg for use with AIS messages with a known size header portion such as in message types 6, 8, 25 or 26). The method comprises determining 610 the maximum number of bits i that a bit-stuffer could add to the header portion based upon the size of the header portion; checking the header portion and calculating the number of bits j that the bit-stuffing step will add to the header portion; and then inserting k=i−j buffer bits after the header portion.

As an alternate implementation, the channel code may include the 40 header bits. This can be done by using a systematic code, where the systematic part extends at least over the 40 header bits.

The purpose of the bit-eraser module 530 (FIG. 5C) is to avoid runs of ones that exceed a given length n. Note that the operation performed by the bit-eraser is different to the bit-stuffing as defined in the AIS specification: bit-stuffing inserts a zero after a given number of ones while bit-erasing forces the bit following a given number of ones to zero (thereby either leaving it unchanged or introducing an error). Hence the output of the bit-eraser will not vary in length.

Figure 7:
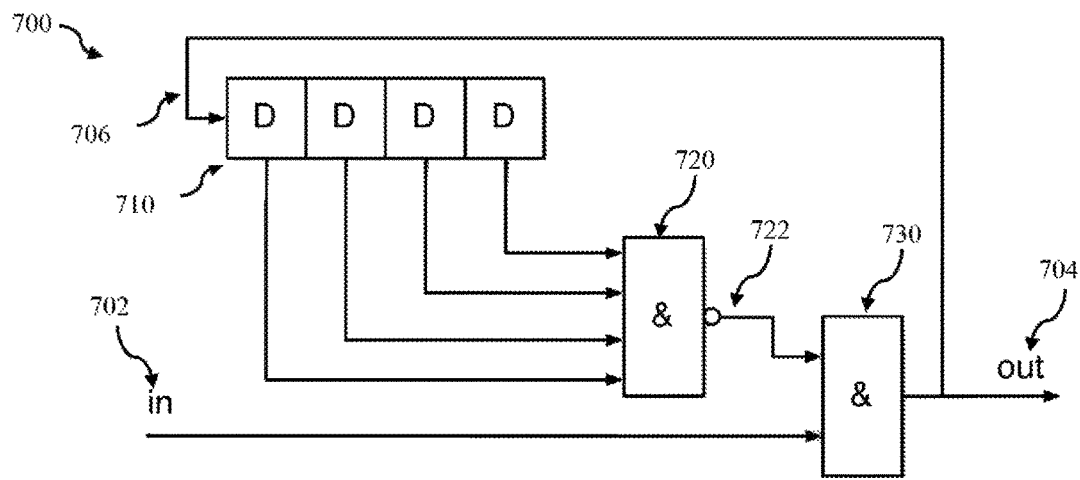
FIG. 7 is a block diagram for a run length limiting encoder where m=4 according to an embodiment.

This encoding scheme cannot be inverted by itself and has to be used in combination with a FEC to achieve error-free reconstruction. However, this scheme can easily be combined with FEC systems and does not introduce any additional overhead to the communications system. FIG. 7 is a block diagram 700) for a run length limiting encoder according to an embodiment. In this embodiment the run n is limited to 4 1's (ie n=4). A shift register 710 receives each previous output bit in sequence via input 706, and the 4 bits are provided to an AND module 720. The output is complemented 722 and provided to a further AND module 730 which also receives the input bit 702. The output of the further AND module is then fed back to the shift register 710. If the shift register is filled with m ones then the output will be forced to zero, otherwise the input passed to the output stays unchanged. That is if a pattern consisting of 4 consecutive 1's is detected then the next symbol will be set to 0. This embodiment can be varied to perform limiting to runs of length n by using a shift register of length n (ie n slots). In another embodiment, the shift register is replaced by a counter that counts the number of consecutive ones and forces the output to zero when it reaches n.

We now turn our attention to the receive side of the AIS system. As outlined above, and illustrated in FIG. 4, a receiver is configured to receive a message incorporating a coded portion encoded using an FEC code. The receiver can be configured to iteratively demodulate and decode the received message by iterating between a soft demodulator (eg soft GMSK demodulator 410) and a soft decoder (eg soft FEC decoder 430) via an intermediate interleave/de-interleaver module 420 until a termination criteria is fulfilled, or if a CRC data value is present in the coded portion of the message, then if the decoded sequence passes a CRC check using the decoded CRC data value.

Soft-decoding of the NRZI. Iterative decoding and demodulation requires soft-decoding of the NRZI. One approach would be to have a soft GMSK demodulator, a soft NRZI decoder and a soft FEC decoder and iterate across these three units. However the performance will be poor as there is no interleaver between the NRZI encoder and the GMSK modulator. An efficient alternate approach is proposed in PCT/AU2013/001501: the NRZI trellis can be merged into the GMSK trellis while the complexity of the joint trellis is the same as the one of the GMSK trellis. A soft joint NRZI/GMSK demodulator operates then on this joint trellis.

Defined states of NRZI/GMSK trellis. The AIS specification defines a training sequence of length 24 bits for acquisition (referred to as the AIS training sequence in the following), which is located at the start of the packet and is intended to be used in connection with non-coherent demodulation. For time-varying channels, low SNR, or multiple-access channels, as is the case for satellite reception of AIS signals, the resulting performance may not be sufficient. Thus in one embodiment channel estimation (acquisition) and coherent demodulation may be applied by using the start flag and end flags as additional training sequences. Further additional training sequences may also be inserted into the middle of the packet.

In the following discussion we assume that a new message type is used, such that the full data field is available. When the existing message types 6, 8, 25 or 26 are employed, the methods as described above for compensating for bit stuffing are required as well to guarantee a fixed packet length and a well-defined start of the data field.

In addition to the AIS training sequence, one, or preferably both, of the start flag 16 and the end flag 18 are used as further training data for acquisition. Using both provides a total of 40 training bits (24 training bits, 8 bits of start flag, 8 bits of end flag) instead of only 24 (standard training sequence 14). Further additional training sequences may be included in the data section of the packet which will reduce the number of bits available for the codeword. Any of these sequences can easily be exploited for acquisition if the state of the NRZI/GMSK trellis is known at the beginning of each sequence, as then the resulting waveform is well-defined. Driving the NRZI/GMSK trellis into a well-defined state is also referred to as trellis termination.

The following approaches enable the NRZI/GMSK trellis to have well-defined states at the beginning of known sequences (training, start flag, end flag).

Start flag. At the beginning of the ramp-up, start the NRZI unit and the GMKS modulator in a well-defined state. Further, during the ramp-up time the input bits to the NRZI are defined (the AIS standard specifies neither the states nor the ramp-up bits). Then the states of the joint NRZI/GMSK trellis at the beginning of the start flag and at the beginning of the training section are well-defined, enabling the soft demodulator to use the start flag as an additional training sequence.

End flag. The joint NRZI/GMSK trellis for the AIS signal has a memory length of 4 bits (Depending on the implementation of the GMSK modulator, this may be 3 bits only.) Therefore with four input bits, the NRZI/GMSK finite state machine can be driven into any desired state. In any of the methods described above, the codeword is shortened by 4 bits, and these four dummy bits are set to values such that the NRZI/GMSK trellis is in a well-defined state at the beginning of the end-flag (a trellis termination sequence). The shortening of the codeword and replacement with dummy bits (or a trellis termination sequence) can be performed in the transmitter, for example by the FEC encoder, or a separate module in the transmitter and can be performed before or after bit erasure. However care must be taken to ensure that adding the dummy bits does not generate a prohibited run of 1's, and thus the bit prior to the dummy bits may also need to be set to zero to ensure the codeword remains run length limited. The values of the bits may be determined by trial-and-error, by a look-up table or by other methods. More generally if the joint NRZI/GMSK trellis has a memory of p bits, then the last p bits of the codeword in the message are replaced by (or reserved for) p dummy bits. The p dummy bits are used to define the states of the joint NRZI/GMSK trellis before the start of an end flag, and the soft demodulator uses the end flag as an additional training sequence. In one embodiment the dummy bits are run length limited. In one embodiment the last p+1 bits of the codeword are replaced with a 0 followed by p dummy bits, to ensure the codeword is run length limited. In one embodiment the trellis termination sequence is inserted just prior to the training sequence, without overwriting the FEC coded data, and the receiver is informed of the location of the end of the coded sequence (either through implanting a defined message format, or by sending the information in a prior message.

Additional training sequence(s). One or more additional training sequences may be added in the data part of the packet, which reduces the codeword length accordingly. With the same method as for the end flag, the state of the NRZI/GMSK trellis at the beginning of each of these training sequences is set to well-defined values. More generally, if the joint NRZI/GMSK trellis has a memory of p bits, and the received message includes an additional training sequence within the message, then the last p bits of the codeword in the received message prior to the additional training sequence are replaced by p dummy bits. The p dummy bits are used to define the states of the joint NRZI/GMSK trellis before the start of the additional training sequence.

If the NRZI/GMSK trellis is not terminated at the beginning of a sequence to be used for acquisition, this sequence may still be exploited, however at higher complexity. The joint NRZI/GMSK trellis (resulting from the AIS standard) has four states. Correspondingly, a training sequence may result in four different waveforms, each one corresponding to one of the trellis states at the beginning of this sequence. An acquisition method may then be applied to each of these four possibilities and the most likely hypothesis can be picked for further demodulation.

Based on the waveforms corresponding to the training sequences, and start and end flag, any method for channel estimation may be applied.

We now turn our attention to the soft decoding module 430. The run-length limiting encoder shown in FIG. 7 can be represented as a finite state machine where the state is determined by the number of consecutive ones that have been observed. A single trellis stage corresponding to this state machine can be generated, and FIG. 8 is a trellis diagram of the run length limiting encoder for limiting the run of 1's to n, such as that shown in FIG. 7 where n=4.

Figure 8:
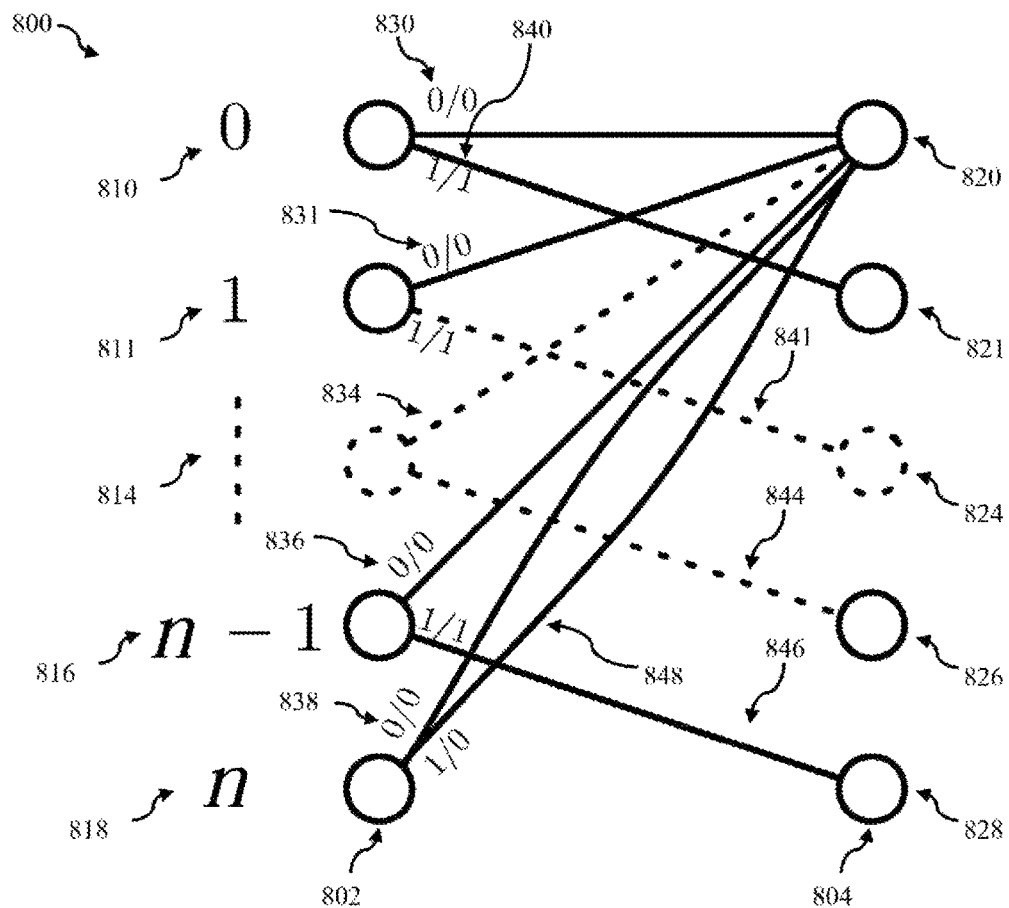
FIG. 8 is a trellis diagram of a run-length limiting encoder according to an embodiment.

FIG. 8 shows a group of states 802 representing the start states (0 . . . n) 810 811 814 816 and 818 and a group of states 804 representing the end states 820 821 824 826 and 828. The first number on each edge represents the input (830, 831, 834, 836, and 838), and the second number the output of the encoder (840, 841, 844, 846, and 848). Therefore, the input sequence passes the encoder unchanged unless the encoder is in state n in which case the output will always be zero (edges 838 848).

Figure 9:
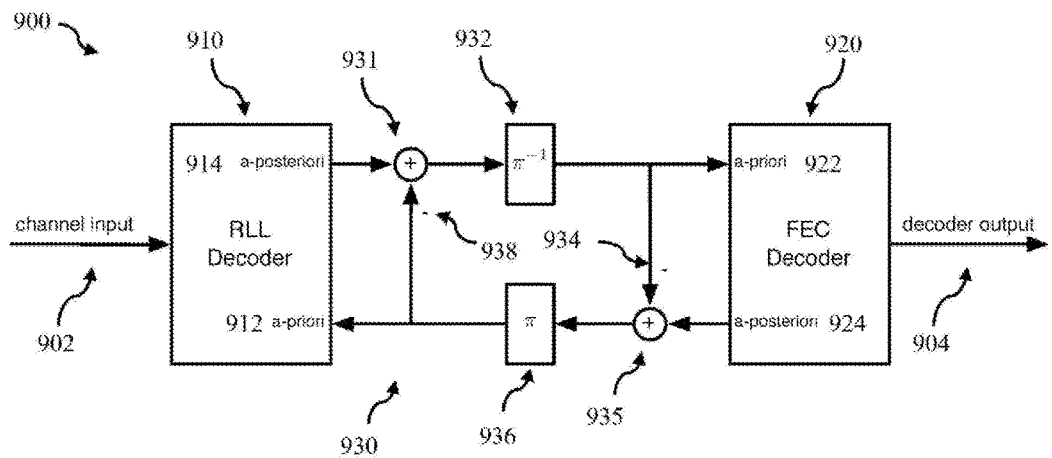
FIG. 9 is a block diagram of an iterative decoder in a receiver according to an embodiment.

Decoder. FIG. 9 is a block diagram 900 of an iterative soft decoder in a receiver according to an embodiment. The soft decoder 430 performs Run Length Limited (RLL) decoding using a RLL decoder module 910 followed by FEC decoding using a FEC decoder module 920 wherein the RLL decoding is performed using a trellis representation of a RLL encoder. The preferred implementation of the RLL decoder is to use the BCJR algorithm (L. R. Bahl, J. Cocke, F. Jelinek, and J. Raviv, "Optimal decoding of linear codes for minimizing symbol error rate," IEEE Trans. Inform. Theory, vol. 20, pp. 284-287, March 1974.) to decode the trellis discussed above and shown in FIG. 8. Since the BCJR algorithm can incorporate a-priori information it is straightforward to combine a soft-in/soft-out channel decoder with the decoder for the run length limited code. Other suitable decoder algorithms include log MAP (log maximum a posteriori), SOVA (soft output viterbi algorithm), and suitable variants.

The BCJR algorithm processes on the trellis as in the example in FIG. 8. Front the output of the BCJR decoder the a-priori information is removed and the interleaved extrinsic information is passed to the FEC decoder as a-priori information. The FEC decoder exploits the constraint of the forward error correcting code and provides the BCJR decoder with a-priori information in a similar way. That is iterating between the RLL decoder module 910 and the FEC decoder module 920 comprises providing an input demodulator sequence 902 which may be a demodulated sequence from the soft NRZI/GMSK demodulator, and a-priori information 912 to the RLL decoder, and RLL decoder generates a RLL output 914. The a-priori information provided to the RLL decoder is removed 938 from the RLL output 931, and is interleaved 932 with extrinsic information before being passing to the FEC decoder as a-priori information 922. The FEC decoder then generates a FEC output which can be passed back to the RLL Decoder as a-posteriori information 924. The a-priori information provided to the FEC decoder 933 is removed from the FEC output 934, and is de-interleaved 936 with extrinsic information before being passing to the RLL decoder as a-priori information 912.

Depending on the FEC that is used (e.g., a low-density parity-check code), the interleaver 930 may be removed. Finally, after either a predetermined number of iterations between the RLL/BCJR decoder and the FEC decoder or after some other suitable stopping criterion, the FEC decoder passes the final output 904 to the next receiver block. In another embodiment, the receiver does not iterate between the RLL decoder 910 and the FEC decoder 920, ie, the RLL decoder is executed once followed by a single execution of the FEC decoder. This implementation has a reduced complexity with only minor loss in performance.

In another embodiment, the receiver ignores the presence of the bit-eraser, ie, all errors introduced by the bit-eraser are treated as they would have been introduced by the communications channel. In this embodiment the RLL decoder module 910 and the interleaver module 930 shown in FIG. 9 may be omitted, and thus this implementation has an even lower complexity with only minor loss in performance.

We now present two numerical examples to demonstrate the improved performance due to FEC coding and improved acquisition. We first consider the transmission of 168 data bits over an AWGN channel. For standard AIS this corresponds to a single-slot message; we assume optimal coherent demodulation (which for the AWGN channel is identical to optimal non-coherent demodulation). For the enhanced FEC-Coded AIS, we apply the method corresponding to entry point 3 for a two-slot AIS message. We consider a rate 1/2 systematic regular repeat accumulate code (the parity part of this codeword, ie, the output of the accumulator, is interleaved for improved decoding performance, as usual) with variable-node degree 3 and check-node degree 3, information word length 168 and codeword length 336. For reduced complexity we assume non-iterative decoding, i.e., the noisy observation from the channel is soft NRZI/GMSK demodulated, soft-decoded over the bit-erasure trellis (see above), and IRA decoded. Note that the uncoded and the coded system transmit the same number of data bits per packet for a fair comparison.

Figure 10:
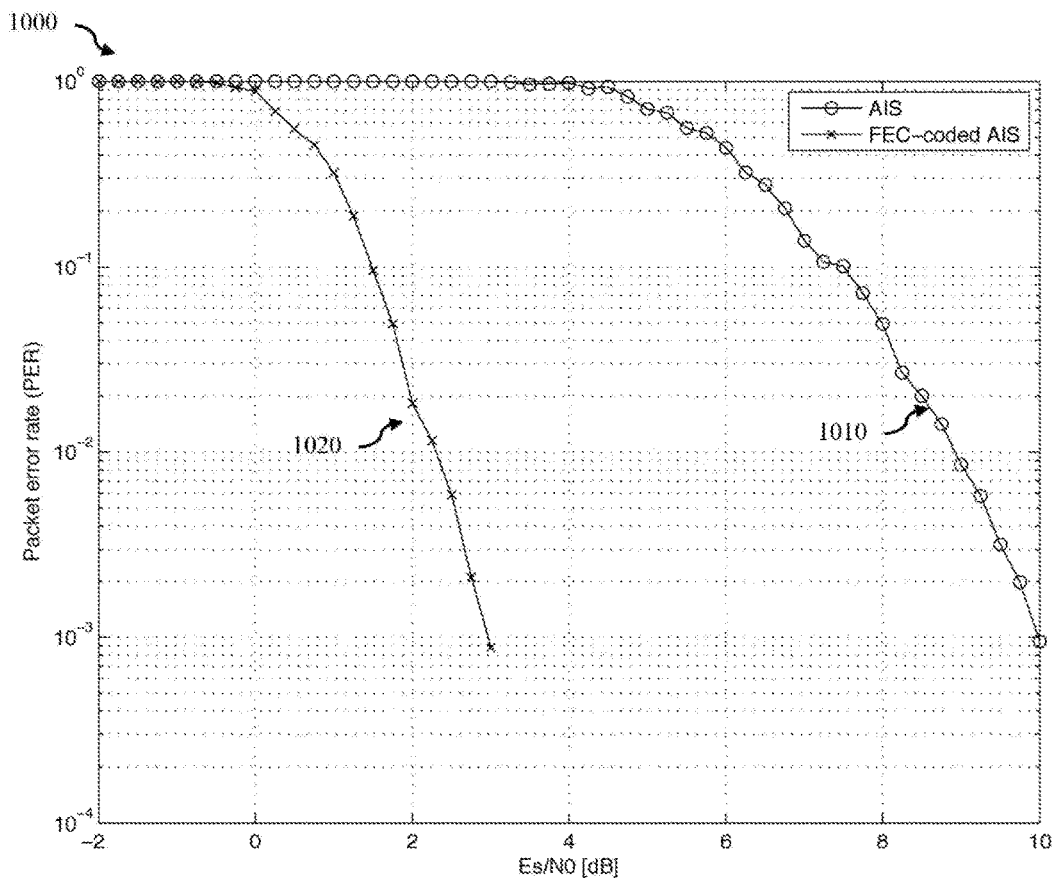
FIG. 10 is a plot of the packet error rate of standard AIS compared to FEC-coded AIS according to an embodiment.

The resulting packet error rates are depicted in FIG. 10 which is a plot 1000 of the packet error rate of standard AIS 1010 compared to FEC-coded AIS 1020 according to an embodiment. To achieve a message error rate (packet error rate) of $10^{-2}$, standard AIS requires an SNR of about 9 dB, while the proposed FEC-coded AIS system achieves the same performance at an SNR of only 2 dB. This dramatic improvement by 7 dB may be exploited to provide service over longer distances or for improved reception from satellites. This greatly enhanced performance comes at the expense of a reduced transmit rate due to the channel code. Depending on the application requirement, this trade-off may be decided towards the error correction capability or towards the transmit rate.

We now investigate the transmission of FEC enhanced AIS over a typical satellite channel, which requires estimation of time delay, frequency offset and frequency rate. For the satellite channel we assume random uniform frequency offsets between +/−1 kHz (no Doppler rate), and random uniform link distances between 600 and 2000 km.

Figure 11:
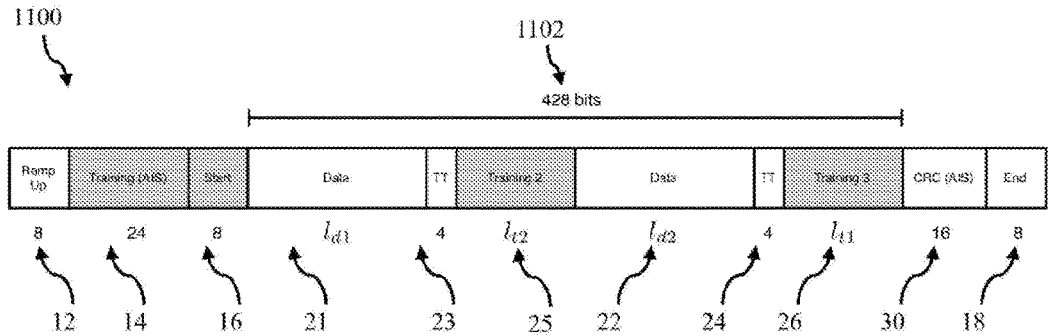
FIG. 11 is a schematic diagram of the general field structure of a multi-slot AIS compliant packet including additional training sequences according to an embodiment.

We consider a two-slot AIS message with 428 data bits. The message format is depicted in FIG. 11 which in this embodiment the packet is a two slot message for advanced acquisition with two additional training sequences of length $l_{t1}$ and $l_{t2}$ in the middle and at the end of the packet. The data section transparent to AIS consists of 428 bits. This section contains two data sections 21 22 (note that the data sections are longer than depicted) of lengths $l_{d1}$ and $l_{d2}$ and two training sections 25 26 (Training 1 and Training 2) of lengths $l_{t1}$ and $l_{t2}$. Note that each training section is prepended by four bits for trellis termination (TT) 23 24. For reduced complexity, the AIS CRC and end flag are not used here, and therefore no dummy bits are required to disable the bit-stuffing for these two parts.

Figure 12:
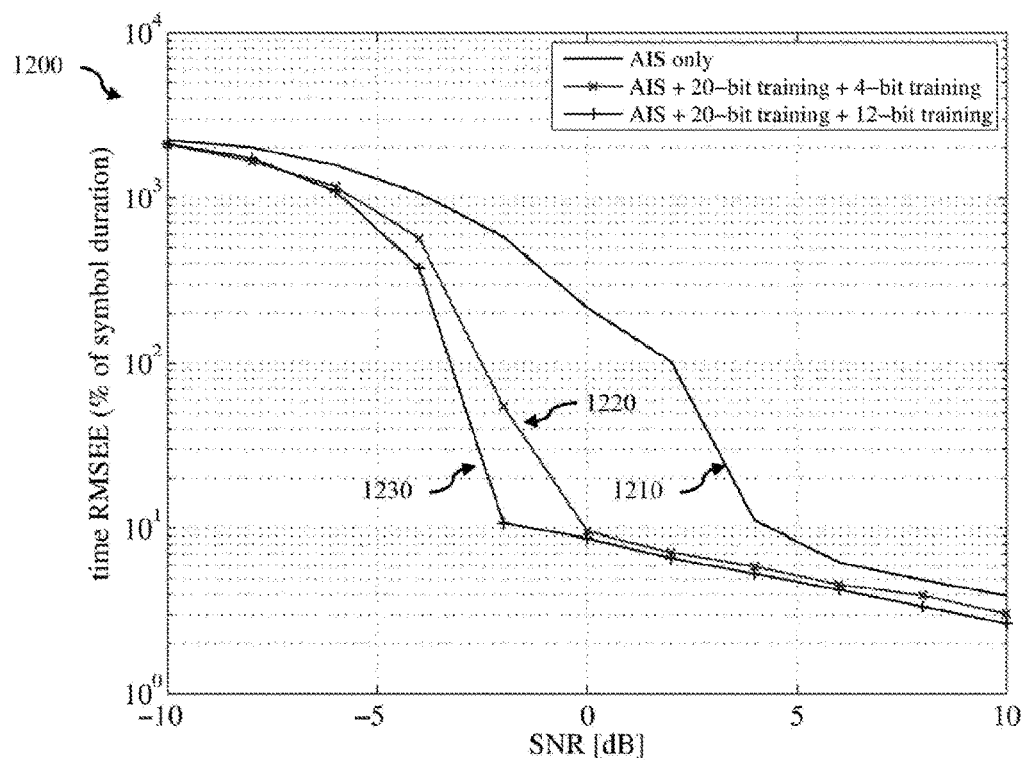
FIG. 12 is a plot of the time estimation for advanced acquisition for standard AIS and FEC-coded AIS using additional training sequences according to an embodiment.
Figure 13:
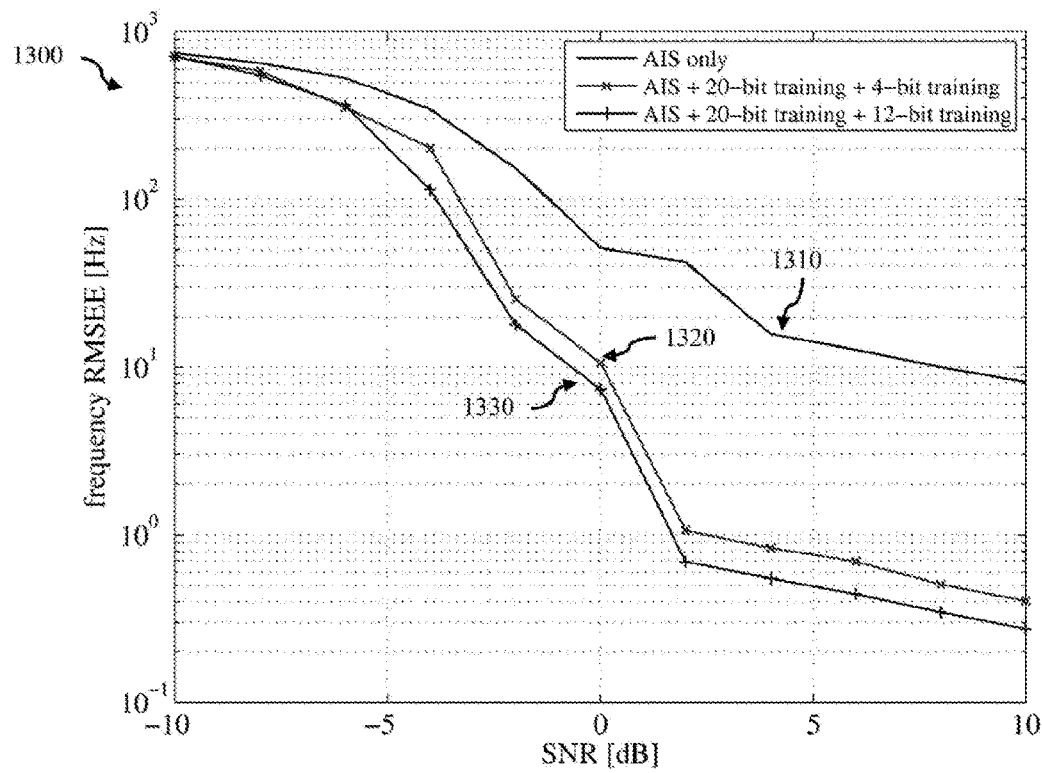
FIG. 13 is a plot of the frequency time estimation for advanced acquisition for standard AIS and FEC-coded AIS using additional training sequences according to an embodiment.

We are interested in studying the resulting quality of the channel estimation in the case that additional training data is provided. We present simulation results for timing and frequency estimation where the following different sets of training data are used: only AIS training sequence and start flag; AIS training sequence and start flag, and the two additional training sequences: $l_{d1}=256$, $l_{t1}=20$, $l_{t2}=4$; and AIS training sequence and start flag, and the two additional training sequences: $l_{d1}=256$, $l_{t1}=20$, $l_{t2}=12$. The results of the timing and frequency estimation are shown in FIGS. 12 and 13 respectively. FIG. 12 is a plot 1200 of the time estimation for advanced acquisition for standard AIS and enhanced AIS using additional training sequences. Curve 1210 plots standard AIS, curve 1220 plots enhanced AIS using an additional 20 bit training and an additional 4 bit training sequence, and curve 1230 plots enhanced AIS using an additional 20 bit training and an additional 12 bit training sequence. FIG. 13 is a plot 1300 of the frequency estimation for advanced acquisition for standard AIS and enhanced AIS using additional training sequences. Curve 1310 plots standard AIS, curve 1320 plots enhanced AIS using an additional 20 bit training and an additional 4 bit training sequence, and curve 1330 plots enhanced AIS using an additional 20 bit training and an additional 12 bit training sequence. The additional training sequences clearly help to improve the timing estimation for SNR below 5 dB. Even stronger is the effect on the frequency estimates. Use of the additional training sequences dramatically improves performance compared to the use of only the AIS training sequence.

The proposed system and methods described herein allows for FEC coding and advanced acquisition in AIS systems that can efficiently improve the performance of the AIS system whilst ensuring that the transmit waveform stays within the requirements imposed by the AIS specification. Performing bit erasure after FEC coding ensures that the codeword is run length limited, so that either a further bit stuffing stage is not required, or if a bit stuffer is present, it will not be activated or will be conditionally activated by careful design of its input sequence. Various embodiments have been described to handle different architectures or input points for the FEC encoder and bit erasure module. The bit erasure module may also add dummy bits to ensure a RLL compliant CRC or selectively adding bits to a reserve buffer to compensate for later bit stuffing in a header. Additional training sequences may also be added to assist in acquisition. Numerical results showed widely improved error rates and channel estimation compared to standard AIS. These advantages allow for: Lower retransmission rates (due to transmit errors) and thus higher throughput or more users; the possibility of iterative acquisition, demodulation and decoding for improved error-rate performance; and the possibility of multi-user decoding to resolve packet collisions for improved error-rate performance. The last two points are particularly critical for high-performance reception from satellites.

The methods and apparatus described herein have been described in relation to the AIS system. However, it is to be understood that embodiments of the method and apparatus could be used in other communication systems where messages for transmission are run-length limited by bit-stuffing, and where it may be desirable to compensate for bit-stuffing to allow use of FEC coding, or where it may be desirable to add additional training sequences to assist in acquisition.

Figure 15:
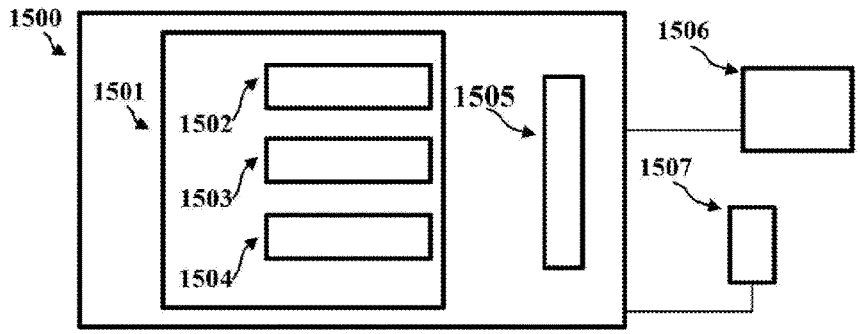
FIG. 15 is a block diagram of a computing device according to an embodiment.

The methods described herein may be a computer implemented using one or more computing devices. The computing device may comprise a processor and a memory, and one or more input or output devices. The memory may comprise instructions to cause the processor to execute a method described herein. These instructions may be stored as computer codes, which are loaded and executed. The computing device may be a standard computing device, such as a desktop computer, server or portable computing device such as a laptop computer, or they may be included in a customised device or system. The computing device may be a unitary computing or programmable device, or a distributed device comprising several components operatively (or functionally) connected via wired or wireless connections. An embodiment of a computing device 1500 is illustrated in FIG. 15 and comprises a central processing unit (CPU) 1501, a memory 1505, and optionally a display apparatus 1506 and an input device 1507 such as keyboard, mouse, etc. The CPU 1501 comprises an Input/Output Interface 1502, an Arithmetic and Logic Unit (ALU) 1503 and a Control Unit and Program Counter element 1503 which is in communication with input and output devices (eg input device 1507 and display apparatus 1506) through the Input/Output Interface. The Input/Output Interface may comprise a network interface and/or communications module for communicating with an equivalent communications module in another device using a predefined communications protocol (e.g. Bluetooth, Zigbee, IEEE 802.15, IEEE 802.11, TCP/IP, UDP, etc). A graphical processing unit (GPU) may also be included. The display apparatus may comprise a flat screen display (eg LCD, LED, plasma, touch screen, etc), a projector, CRT, etc. The computing device may comprise a single CPU (core) or multiple CPUs (multiple core). The computing device may use a parallel processor, a vector processor, or be a distributed computing device. The memory is operatively coupled to the processor(s) and may comprise RAM and ROM components, and may be provided within or external to the device. The memory may be used to store the operating system and additional software modules that can be loaded and executed by the processor(s).

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number of source code or object code segments or instructions, and may reside in any computer readable medium such as a RAM memory, flash memory, ROM memory, EPROM memory, registers, hard disk, a removable disk, a CD-ROM, a DVD-ROM or any other form of computer readable medium. In the alternative, the computer readable medium may be integral to the processor. The processor and the computer readable medium may reside in an ASIC or related device. The software codes may be stored in a memory unit and executed by a processor. The memory unit may be implemented within the processor or external to the processor, in which case it can be communicatively coupled to the processor via various means as is known in the art.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the an that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention as set forth and defined by the following claims.

The invention claimed is:

1. A method for generating a message for transmission in a system that requires the message to be run length limited (RLL) to a run of n first binary states by bit-stuffing, the method comprising:
    coding at least a data portion of a binary sequence for transmission using a forward error correction (FEC) code to generate a FEC coded portion of the binary sequence;
    bit erasing one or more bits in at least the FEC coded portion to compensate for the run of n first binary states in the FEC coded portion of the binary sequence so that the FEC coded portion is RLL without requiring insertion of additional bits, wherein the bit-erasing step implements selective bit erasing, wherein if a $n+1^{th}$ bit after the run of n first binary states is equal to a first binary state of the n first binary states, the $n^{th}$ bit is set to a second binary state of the n first binary states and if the $n+1^{th}$ bit after the run of n first binary states is equal to the second binary state, then the $n+1^{th}$ bit is removed from the binary sequence;
    bit stuffing the bit erased binary sequence, wherein bit-stuffing comprises insertion of the second binary state after the $n^{th}$ first binary state; and
    providing the bit erased and bit stuffed binary sequence to a transmitter for modulation and subsequent transmission.

2. The method as claimed in claim 1, further comprising the following steps after the bit erasing step but before the bit-stuffing step if the bit stuffing step is performed:
    adding a set of m dummy bits to the FEC coded portion;
    generating a cyclic redundancy check (CRC) value for the FEC coded portion and appended m dummy bits; and
    checking if the CRC value includes the run of n first binary states and if the CRC value includes the run of n first binary states then repeating the adding, generating and checking steps until m dummy bits are found such that the CRC value does not include the run of n first binary states wherein each time the adding step is repeated a different set of m dummy bits are added.

3. The method as claimed in claim 1, wherein the binary sequence further comprises a header portion preceding the data portion, and the bit stuffing step is performed on the header portion and the FEC coded portion, and the method further comprises the following steps prior to the coding step:
    determining a maximum number of bits i that a bit-stuffer could add to the header portion based upon the size of the header portion;
    checking the header portion and calculating a number of bits j that the bit-stuffing step will add to the header portion; and
    inserting k=i−j buffer bits after the header portion.

4. The method as claimed in claim 1, further comprising the step of:
    adding a trellis termination sequence prior to a training sequence, wherein the trellis termination sequence is a sequence that places a joint Non Return Zero Inverted/Gaussian Minimum Shift Keying (NRZI/GMSK) trellis in the transmitter in a defined state prior to the start of the training sequence, and where the trellis termination sequence is run length limited.

5. The method as claimed in claim 1, further comprising: inserting a training sequence into the data portion or the FEC coded portion,
wherein the training sequence is not FEC encoded and is located between a first FEC encoded portion and a second FEC encoded portion.

6. The method as claimed in claim 1, wherein the transmitter transmits the binary sequence as a series of messages in a plurality of slots.

7. An Automatic Identification System (AIS) compliant transmitter, the transmitter comprising:
an encoder configured to encode at least a data portion of a binary sequence for transmission using a forward error correction (FEC) code to generate a FEC coded portion of the binary sequence;
a bit eraser module configured to selectively bit erase one or more bits in at least the FEC coded portion to compensate for a run of n first binary states in the FEC coded portion of the binary sequence so that the FEC coded portion is Run Length Limited (RLL) without requiring insertion of additional bits, wherein the bit eraser module detects a run of n first binary states and then checks the n+1$^{th}$ bit and if equal to the first binary state then the n$^{th}$ bit is set to a second binary state and if the n+1$^{th}$ bit is equal to the second binary state then the n+1$^{th}$ bit is removed from the binary sequence;
a bit stuffing module configured to detect the presence of a run of n bits each with the first binary state and on detection insert a bit with the second binary state after the nth bit;
an interleaver; and
a modulator configured to modulate an interleaved binary sequence for transmission.

8. The AIS compliant transmitter as claimed in claim 7, further comprising a cyclic redundancy check (CRC) module configured to:
receive the binary sequence from the bit eraser module and provide an output binary sequence to the bit stuffing module;
add a set of m dummy bits to the FEC coded portion;
generate a cyclic redundancy check (CRC) value for the FEC coded portion and appended m dummy bits; and
check if the CRC value includes a run of n first binary states and if the CRC value includes a run of n first binary states then repeating the adding, generating and checking steps until m dummy bits are found such that the CRC value does not include a run of n first binary states wherein each time the adding step is repeated a different set of m dummy bits are added.

9. The AIS compliant transmitter as claimed in claim 7, wherein the binary sequence further comprises a header portion preceding the data portion, wherein the bit stuffing module is further configured to process the header portion and the FEC coded portion, and wherein the AIS compliant transmitter is further configured to process the binary sequence prior to the encoder by:
determining a maximum number of bits i that the bit stuffing module could add to the header portion based upon the size of the header portion;
checking the header portion and calculating a number of bits j that the bit stuffing module will add to the header portion; and
inserting k=i−j buffer bits after the header portion.

10. The AIS compliant transmitter as claimed in claim 7, further comprising a framing module after the bit stuffing module and prior to a Non Return Zero Inverted (NRZI) encoder and Gaussian Minimum Shift Keying (GMSK) modulator, wherein the framing module is configured to add a trellis termination sequence prior to a training sequence, wherein the trellis termination sequence is a sequence that places a joint NRZI/GMSK trellis in the transmitter in a defined state prior to the start of the training sequence, and where the trellis termination sequence is run length limited.

11. The AIS compliant transmitter as claimed in claim 7, further configured to insert a training sequence into the data portion or the FEC coded portion wherein the training sequence is not FEC encoded and is inserted between a first FEC encoded portion and a second FEC encoded portion.

12. The AIS compliant transmitter as claimed in claim 7, wherein the transmitter transmits the binary sequence as a series of messages in a plurality of slots.

13. A communication system including:
a transmitter apparatus comprising:
an encoder configured to encode at least a data portion of a binary sequence for transmission using a forward error correction (FEC) code to generate a FEC coded portion of the binary sequence;
a bit eraser module configured to selectively bit erase one or more bits in at least the FEC coded portion to compensate for a run of n first binary states in the FEC coded portion of the binary sequence so that the FEC coded portion is Run Length Limited (RLL) without requiring insertion of additional bits, wherein if a n+1$^{th}$ bit after the run of n first binary states is equal to the first binary state, the n$^{th}$ bit is set to a second binary state and if the n+1$^{th}$ bit after the run of n first binary states is equal to the second binary state, then the n+1$^{th}$ bit is removed from the binary sequence; and
an interleaver; and
a modulator configured to modulate an interleaved binary sequence for transmission; and
a receiver apparatus comprising:
a soft demodulator;
an interleaver module; and
a soft decoder comprising an FEC decoder module.

14. The communication system as claimed in claim 13, wherein the transmitter apparatus further comprises a bit stuffing module and a cyclic redundancy check (CRC) module, the CRC module configured to:
receive the binary sequence from the bit eraser module and provide an output binary sequence to the bit stuffing module;
add a set of m dummy bits to the FEC coded portion;
generate a CRC value for the FEC coded portion and appended m dummy bits; and
check if the CRC value includes the run of n first binary states and if the CRC value includes the run of n first binary states then repeating the adding, generating and checking steps until m dummy bits are found such that the CRC value does not include the run of n first binary states wherein each time the adding step is repeated a different set of m dummy bits are added.

15. The communication system as claimed in claim 13, wherein the transmitter apparatus further comprises a bit stuffing module, wherein the binary sequence further comprises a header portion preceding the data portion, and wherein the bit stuffing module is configured to process the header portion and the FEC coded portion, and wherein the transmitter apparatus is further configured to process the binary sequence prior to the encoder by:
- determining a maximum number of bits i that the bit stuffing module could add to the header portion based upon the size of the header portion;
- checking the header portion and calculating a number of bits j that the bit stuffing module will add to the header portion; and
- inserting k=i−j buffer bits after the header portion.

16. The communication system as claimed in claim 13 wherein the receiver apparatus is configured to iteratively demodulate and decode a received message by iterating between the soft demodulator and the soft decoder via the interleaver module until a termination criteria is fulfilled, or if a CRC data value is present in the coded portion of the message, then if the decoded message passes a CRC check using the decoded CRC data value.

17. The communication system as claimed in claim 16 wherein the soft decoder comprises a Run Length Limited (RLL) decoder module and a FEC decoder module and the soft decoder performs RLL decoding using the RLL decoder module followed by FEC decoding using the FEC decoder module wherein the RLL decoding is performed using a trellis representation of a RLL encoder, and one or more iterations between the RLL decoder module and the FEC decoder module are performed.

* * * * *